(12) United States Patent
Mayes

(10) Patent No.: US 7,474,017 B2
(45) Date of Patent: Jan. 6, 2009

(54) LOW IMPEDANCE HIGH PERFORMANCE PULSE GENERATOR

(75) Inventor: Jonathan R. Mayes, Austin, TX (US)

(73) Assignee: Applied Physical Electronics, L.C., Austin, TX (US)

( * ) Notice: Subject to any disclaimer, the term of this patent is extended or adjusted under 35 U.S.C. 154(b) by 221 days.

(21) Appl. No.: 11/451,234

(22) Filed: Jun. 12, 2006

(65) Prior Publication Data

US 2007/0296342 A1    Dec. 27, 2007

(51) Int. Cl.
*H03K 3/00* (2006.01)
(52) U.S. Cl. ...................................... 307/108
(58) Field of Classification Search ................ 307/108
See application file for complete search history.

(56) References Cited

U.S. PATENT DOCUMENTS

| | | | |
|---|---|---|---|
| 4,900,947 A | 2/1990 | Weiner et al. | |
| 4,912,369 A | 3/1990 | Moran et al. | |
| 5,105,097 A | 4/1992 | Rothe | |
| 5,311,067 A | * 5/1994 | Grothaus et al. | ............ 307/108 |
| 5,798,579 A | 8/1998 | McPhee | |
| 6,060,791 A | * 5/2000 | Goerz et al. | ................ 307/110 |
| 6,211,683 B1 | 4/2001 | Wolf | |

OTHER PUBLICATIONS

D. Platts, GigaWatt Marx Bank Pulsers, Ultra-Wideband Radar: Proceedings of the First Los Alamos Symposium, Ed. Bruce Noel, CRC Press, 1991.
C.E. Baum, "Traveling-Wave Switches and Marx Generators," Switching Note 33, Air Force Research Laboratory/DEHP, Kirtland AFB NM, Mar. 2005.

* cited by examiner

*Primary Examiner*—Robert L. Deberadinis
(74) *Attorney, Agent, or Firm*—David Allen Hall

(57) ABSTRACT

A compact Marx-type generator capable of producing high voltage pulses into low impedance loads. A parallel switch and distributed capacitance topology produce a coaxial-like conduction through the Marx-like circuit, resulting in a low source impedance. The parallel switching topology also lends itself to high repetition rates. Without loss of generality the device may be used, for example, as a source for vacuum diode loads, such as in flash radiography and high power microwaves.

20 Claims, 5 Drawing Sheets

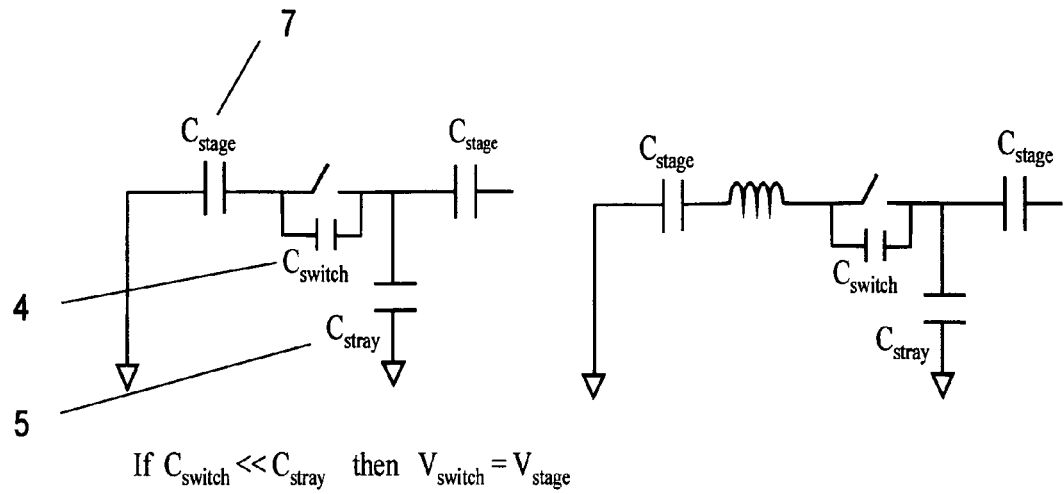
If $C_{switch} \ll C_{stray}$ then $V_{switch} = V_{stage}$
Figure 3a                                                                       Figure 3b
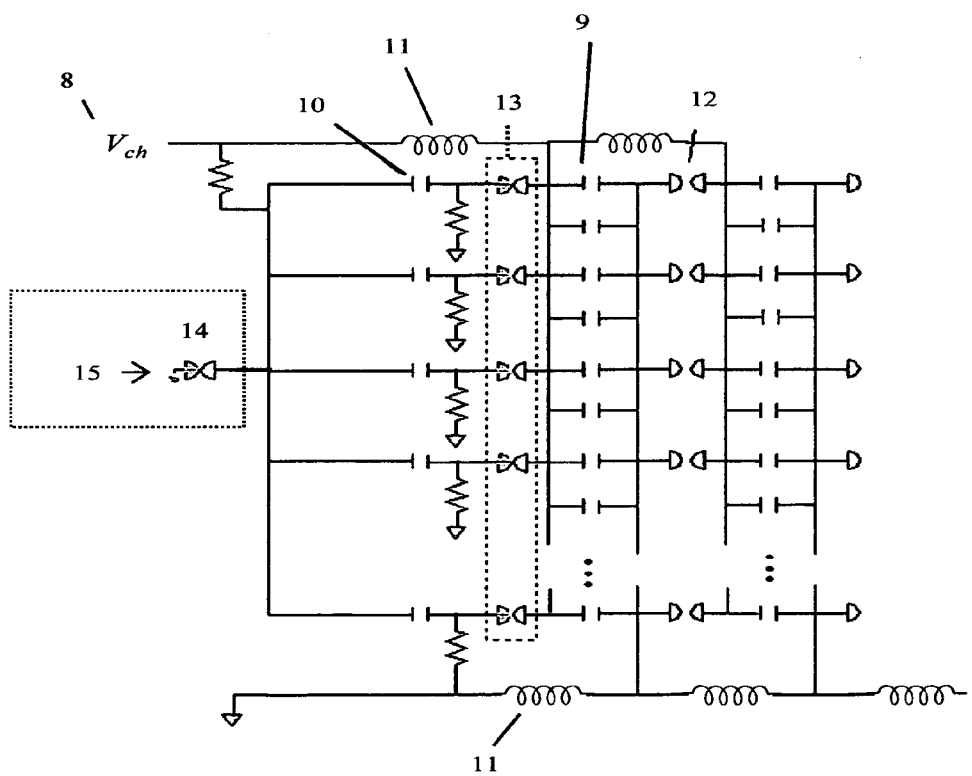
Figure 4

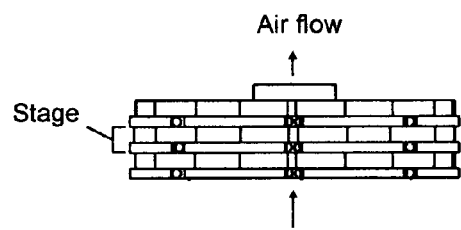
Figure 8a
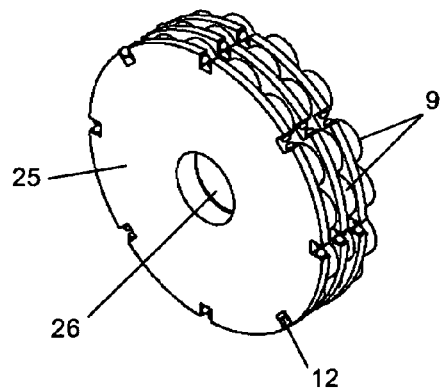
Figure 8b
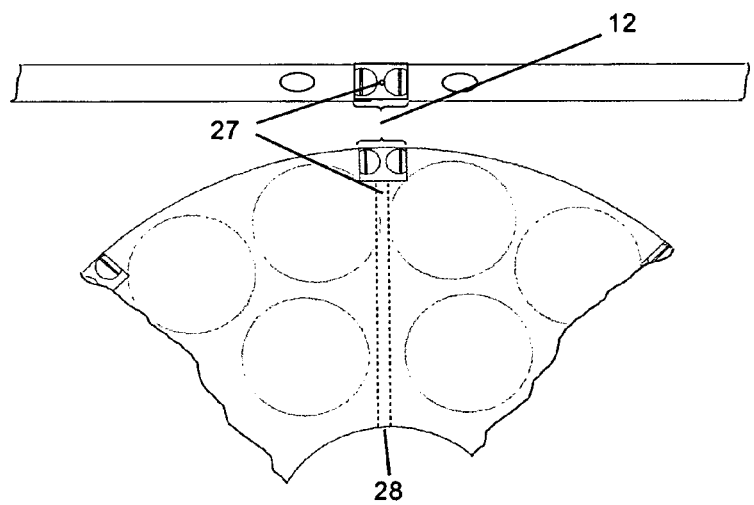
Figure 9a
Figure 9b

LOW IMPEDANCE HIGH PERFORMANCE PULSE GENERATOR

This invention was made with Government support under F33615-02-C-2279 awarded by the United States Air Force. The Government has certain rights in the invention.

FIELD OF THE INVENTION

The present invention pertains to the field of electronic pulse generation, namely pulsed power sources, and is an improvement over existing Marx-like circuits for producing high voltage pulses.

BACKGROUND OF THE INVENTION

The Marx-type generator, herein simply referred to as a Marx generator, is a voltage multiplying circuit in which N capacitors are charged, with a power source, in parallel, to an input voltage $V_{ch}$, after which the charged capacitors are switched into a series configuration so that the output voltage, in a temporary short burst, equals the sum of the voltages across each of the capacitors, or $N \cdot V_{ch}$. This voltage multiplication enables the designer to achieve extremely high output voltages with a relatively low input voltage power supply.

Each Marx generator stage typically incorporates a switch designed to close at a predetermined voltage. At closure, the capacitor stages add, or, in the commonly understood industry terminology, "erect," to form an overall capacitance that is equal to the individual stage capacitance divided by the number of stages, and the resultant output voltage is the individual stage voltage multiplied by the number of stages.

The simple Marx circuit, schematically depicted in FIG. 1, illustrates a resistively charged circuit, or one in which the stage capacitors, $C_s = C_{stage}$ (1), are charged via resistive elements, $R_{ch}$ (3). The stage capacitors 1 are additionally connected via switches S (2), so that with nearly simultaneous closure, the stage capacitors 1 are connected in a series configuration. Thus a single stage may be defined by the stage capacitor 1, two charging resistors 3, and a switch 2. For charge voltages from 10's of kilovolts (kV), spark gap switches are employed.

In general, a Marx generator's characteristic impedance is proportional to the circuit's geometrical inductance divided by its series capacitance, calculated under the condition that the stage switches are closed, as follows:

$$Z_{source} \propto \sqrt{\frac{L}{C}}. \quad (1)$$

The generator's capacitance is defined by the simple series relationship $$C_{marx} = C_{stage}/N, \quad (2)$$

where N defines the number of Marx stages in the circuit. The generator's inductance is defined as the total of the inductance values geometrically defined for each Marx stage:

$$L_{marx} = N \, L_{stage}. \quad (3)$$

From equation (1), $$Z_{marx} \propto \sqrt{\frac{L_{marx}}{C_{marx}}} = \sqrt{\frac{N \, L_{marx}}{C_{marx}/N}} = N \sqrt{\frac{L_{marx}}{C_{marx}}}. \quad (4)$$

The voltage realized on the load becomes $$V_{load} = N \, V_{ch} \frac{Z_{load}}{Z_{load} + Z_{marx}}. \quad (5)$$

As a result of equations (4) and (5), large values for $Z_{marx}$ reduce the voltage efficiency on the load, as the load voltage is highly dependent on the number of stages with respect to the stage capacitance.

Compact applications designed around single capacitor geometries and requiring a large number of stages can result in large source impedances to the extent of a Marx circuit being inappropriate due to voltage inefficiencies caused by impedance mismatches between the Marx circuit and the load. As a result, the primary application of the Marx circuit has been as a trigger source in which high impedance loads are well matched with the Marx generator. See for example Grothaus (U.S. Pat. No. 5,311,067).

Marx generator applications calling for moderate to high energy stores but having non-stringent volumetric constraints minimize impedance problems by employing large stage capacitors. However, for very low impedances, e.g. less than 30 Ohms, driving low characteristic impedances with a typical Marx generator is difficult, if not impossible. As a result, the Marx generator is typically relegated to the role of a voltage multiplier designed to pulse charge an intermediate energy store the coupling efficiency to low impedance loads of which is better than that of the Marx generator itself To summarize the impedance problem facing designers of a Marx circuit, compact geometries are traditionally best suited for trigger applications characterized by high impedance loads. Applications allowing larger volumes with minor emphasis on energy efficiency can rely on large stage capacitances to better match low impedance loads.

Goerz (U.S. Pat. No. 6,060,791) describes a compact Marx generator circuit that realizes a high energy density geometry via novel packaging designed to reduce the overall circuit length. Ultimately the Marx circuit's inductance was reduced; however, the overall characteristic impedance of the generator was not reduced due to the centrally-located stage switch and the absence of a suitable ground plane. The Goerz geometry therefore produces a low load voltage efficiency.

The basis for higher voltage efficiencies in Marx circuits partly lies in the proper design of stray components, which is obtained by encapsulating the Marx circuit with a ground plane. Proper design of the stray elements leads to a Marx circuit design referred to as wave erection (see D. Platts, *GigaWatt Marx Bank Pulsers*, Ultra-Wideband Radar: Proceedings of the First Los Alamos Symposium, Ed. Bruce-Noel, CRC Press, 1991). Such a design is also referred to as wave triggering (see C. E. Baum, "Traveling-Wave Switches and Marx Generators," Switching Note 33, Air Force Research Laboratory/DEHP, Kirtland AFB NM, March 2005), which is essentially the manner in which the stage switches close sequentially in a cascaded manner.

The full Marx circuit is shown in FIG. 2. The classic circuit is well understood. Less appreciated are the stray elements defined by the geometry of the circuit. Stray elements may be considered as stage-to-stage capacitance, and includes the switch capacitance $C_{switch}$ (4), the stage-to-ground capacitance $C_{stray}$ (5), and the stage series inductance $L_{stray}$ (6). Each of these stray components drastically affects the performance of a Marx generator.

Consideration of the relationships among capacitive elements is critical in the design of a pulse generator. In general, once the voltage across the first switch has collapsed, that potential should be realized across the second gap, instead of being distributed among all subsequent gaps. Furthermore, that same potential should ideally be maximized on the spark gap switch instead of across the associated stray capacitance to ground. As illustrated in FIG. 3a, the voltage on $C_{stage}$ (7) is distributed across the capacitor divider of the gap switch capacitance $C_{switch}$ (4) and the stray-to-ground capacitance $C_{stray}$ (5). For the potential to be maximized across the switch, $C_{stray}$ (5) must be much larger than $C_{switch}$ (4), and to minimize the amount of energy lost in the stray components, $C_{stage}$ (7) must be the dominant capacitive element over the stray capacitance. Thus wave erection is made possible by the following condition:

$$C_{stage} \gg C_{stray} \gg C_{switch} \quad (6)$$

As discussed by Baum, inductance plays a very important role in Marx circuit operation. Large gap inductance, mostly due to suboptimal placement of the switches with respect to the ground plane, leads to slowed switch closure, which in turn increases the temporal jitter of each switch, and consequently the Marx generator as a whole.

Traditional roles for the Marx generator have been complimentary to single shot applications or events requiring repetition rates of up to a few Hz. In such applications resistors are well suited for the charging elements. However, for higher repetition rates and resultant higher charge rates, resistors must be replaced by inductors.

Recovery of the spark gap switches can be problematic when operating at high repetition rates, since the gaseous medium in the gap must de-ionize before the gap can be recharged to a high voltage. For moderate repetition rates, the insulating gas can be physically moved, so as to purge the ionized particulate from the gap. This usually requires bulky mechanical equipment capable of transferring gas at high rates through the entire Marx structure.

An alternative method was described by Moran (U.S. Pat. No. 4,912,369), Grothaus (U.S. Pat. No. 5,311,067), and McPhee (U.S. Pat. No. 5,798,579), in which high pressure hydrogen was used as the insulating medium in the spark gaps. Moran, Orothaus, and McPhee claim short burst repetition rates as high as 10 kHz, but do not discuss the pressurized hydrogen gas flow necessary for such performance.

SUMMARY OF THE INVENTION

An object of the present invention is to provide a very compact Marx-type high voltage generator.

A further object of the present invention is to provide a generator of moderate energy store and low characteristic impedance.

A further object of the present invention is to provide a generator capable of operating with high repetition rates while achieving average powers of several 10's of kilowatts (kW).

In the embodiment, a repetitively-switched, compact Marx generator is comprised of a Marx circuit of N stages and encapsulated in a conductive metallic housing that has been insulated for high voltages, a command-charge high voltage power supply, an external high voltage trigger source, and a regulated compressed filtered air source (SCUBA air). Each stage of the generator is comprised of several high voltage capacitors, multiple and parallel high voltage switches, inductive charging elements, and air conduits for purging ionized air from individual spark gaps between closures.

The present invention generator design relies on a unique parallel switching topology. With the spark switches located in close proximity to the ground plane and optically aligned with subsequent stage switches, the parallel spark gaps reliably close to simulate a coaxial conduction of current through the Marx circuit. This simulated coaxial configuration minimizes the generator's characteristic impedance.

Furthermore, the gaseous medium used to insulate the spark gap switches is channeled from a central air handler to each spark gap switch, thereby purging the ionized gas from the spark gaps between closures and ultimately reducing the recovery time of the spark gaps. Thus, with an inductor-based charging scheme and a command-charge high voltage power supply, high repetition rates are achieved.

The primary advantage of the present invention is use of a Marx generator of low characteristic impedance to directly source low impedance loads such as vacuum diodes used in flash radiography and high power microwaves. Low generator impedance will free designers to directly attach generators to loads without the requirement of an intermediate energy store. Furthermore, the switching topology, coupled with the air flow management enables the generator to operate with higher repetition rates which ultimately lead to higher average powers desired by high power microwave designers.

BRIEF DESCRIPTION OF THE DRAWINGS

The structure and operation of the invention will become apparent upon reading the following detailed description of the preferred embodiment and upon reference to the accompanying drawings in which like details are labeled with like identification numbers throughout. The drawings do not conform to a consistent scale.

FIGS. 1-9 illustrate the preferred embodiment of the present invention.

FIG. 1 is a schematic of the simple Marx circuit based on a resistive charging scheme and generic switches.

FIG. 2 is a schematic of a Marx circuit including stray elements created by the presence of an encapsulating ground plane.

FIGS. 3a and 3b are schematics of the voltage division among Marx stage elements and the wave erection principle, which is primarily dependent on the relationship between the capacitances at each stage of a Marx generator. FIG. 3a illustrates the relationship among capacitive elements, and FIG. 3b includes the inductive elements.

FIG. 4 is a schematic illustration of the preset invention.

FIG. 5 is a cross sectional view of the main trigger unit of the present invention.

FIG. 6 is a cross sectional view of the Marx generator of the present invention.

FIG. 7 is a partial cross sectional drawing of the electrical connections of a stage of the present invention.

FIGS. 8a and 8b are assembly drawings of some Marx stages of the present invention.

FIGS. 9a and 9b are, respectively, partial cutaway side and plan views of a Marx stage of the present invention.

DETAILED DESCRIPTION OF THE PREFERRED EMBODIMENT

Figure 1:
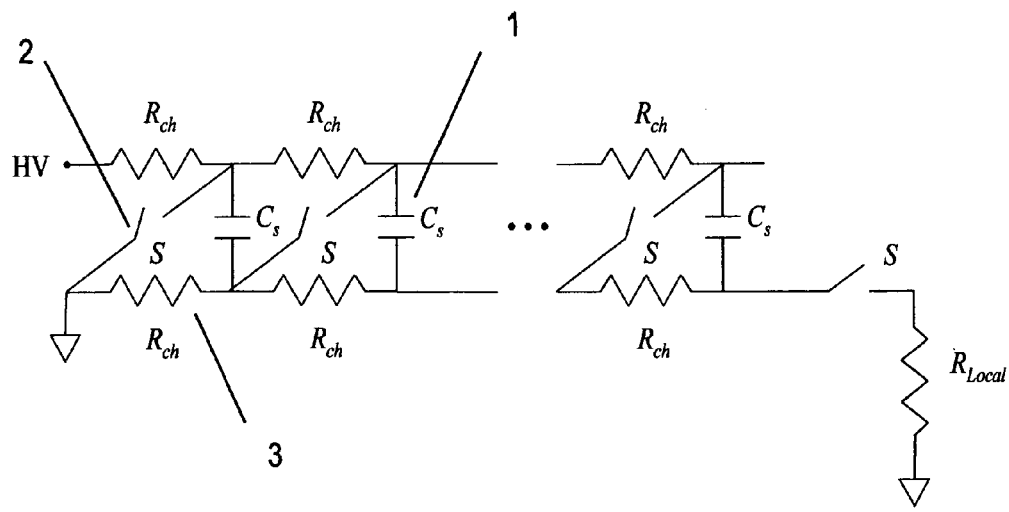
Figure 2:
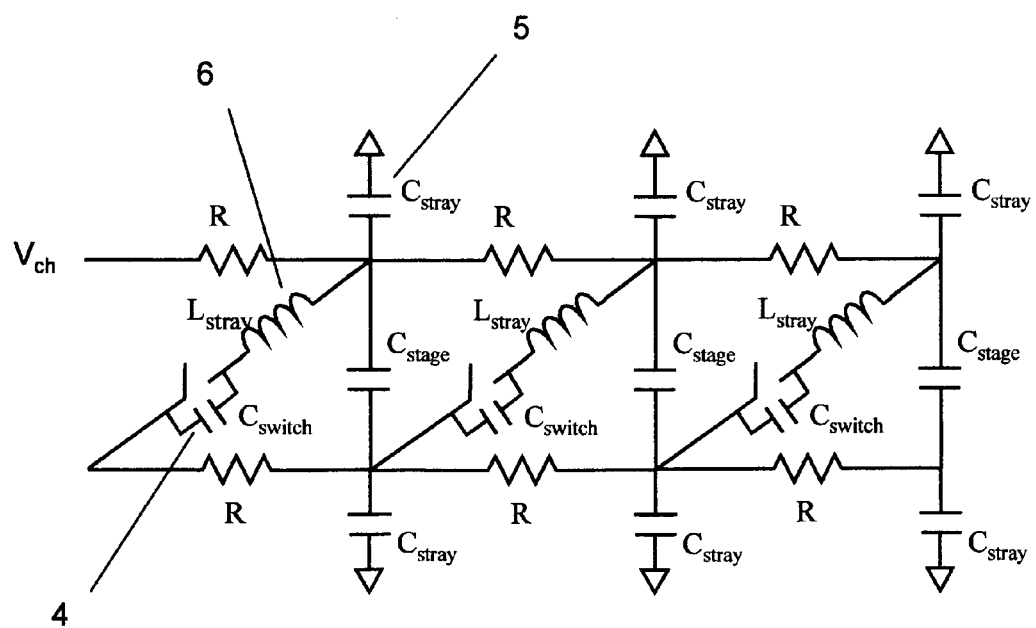

The simplified schematic of FIG. 1 is the basic circuit for Marx generators, including the circuit of this invention.

Present invention improvement modifications to the basic circuit include replacement of the charging resistors 3 with charging inductors, the expansion from a single stage capacitor 1 to multiple distributed capacitors, and replacement of the typical single stage switch 2 with multiple stage switches in parallel.

The schematic of FIG. 4 provides a simple circuit description for the present invention. The charging voltage $V_{ch}$ (8) connects to the Marx circuit via a single point connection and charging inductors 11, and provides charge to the stage capacitors 9 and the trigger capacitors 10. The high voltage switches are implemented with two-electrode, over-voltaged spark gaps 12. The first stage spark gaps are implemented with trigatron spark gaps 13 equal in number to the number of parallel spark gap switches for each Marx stage. Each trigatron spark gap has a unique trigger circuit with its own charging resistor and trigger capacitor 10. However, all of the parallel trigger circuits share a common and central trigger switch 14 that has been implemented with a trigatron spark gap as well.

The operation of the trigger circuit is as follows: each trigger capacitor 10 is charged to the primary charging voltage 8, which also creates a high voltage across the main trigger switch 14. An external high voltage pulse 15 triggers the main trigger switch 14. Closure of the main trigger switch 14 simultaneously ties each of the trigger capacitors 10 to a ground potential, thus causing the parallel trigatron trigger gaps 13 to close.

Distributing the generator power among multiple parallel switches results in repetition rates higher than are achievable delivering the same total power through a single switch. This result is due to spark gap recovery from breakdown being proportional to the amount of energy delivered through the gap. The higher the energy delivered through a spark gap, the more heavily ionized the gap becomes. The ionization is realized as channel heating, and dissipating the undesirable heat and de-ionizing the gap requires additional time. Therefore, distributed, lower gap current means faster gap recovery times and higher charge rates.

Figure 5:
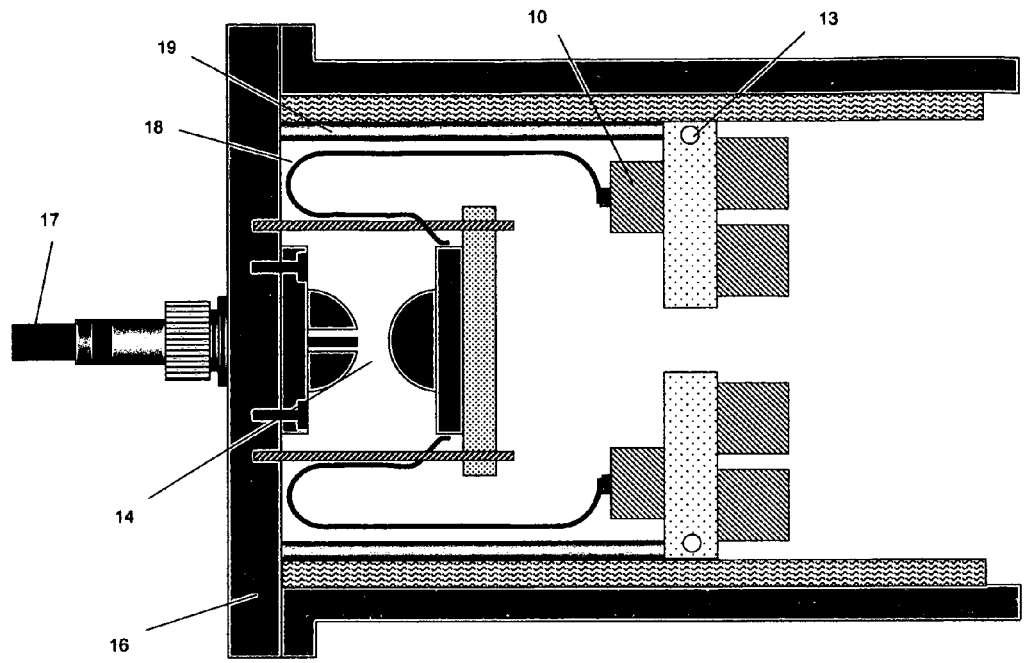

The physical implementation of the trigger circuit is illustrated in FIG. 5. The main trigger switch 14 is mounted directly to the input bulkhead 16, and the external trigger pulse is delivered via coaxial cable 17 that connects directly to the trigger pin of the main trigger switch 14. An insulated heavy gauge wire 18 connects the main trigger switch 14 to each trigger capacitor 10. The connection wires 18 are routed in close proximity to the ground plane for minimization of stray inductance that would otherwise adversely affect the rise time of the trigger pulses. The connection wires continue to each trigger capacitor, following a ground rod 19 placed behind each trigatron switch 13. The ground rods ultimately provide the ground connection to the Marx circuit and maintain the parallel conduction path created by the parallel switches in the subsequent stages.

Figure 6:
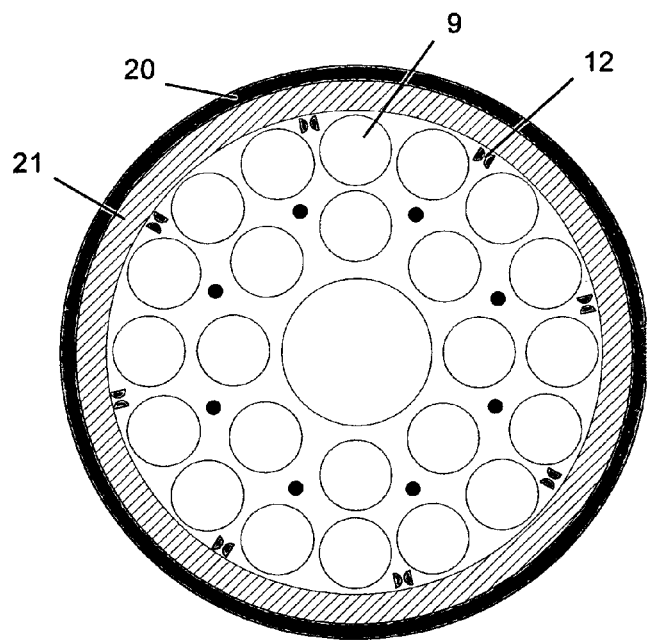

The general cross sectional geometry of the present invention generator is depicted in FIG. 6. A number of high voltage ceramic doorknob capacitors 9 (for example, TDK part number UHV-6A) are distributed within a circular area. Parallel spark gap switches 12 are located near the circumference of the circular area and are connected to the stage capacitors 9 with conductive interconnection tabs. Encapsulating the Marx circuit is a conductive cylinder 20. Plastic liner 21 prevents a short circuit from arcing between the Marx circuit and the conductive ground plane.

Figure 7:
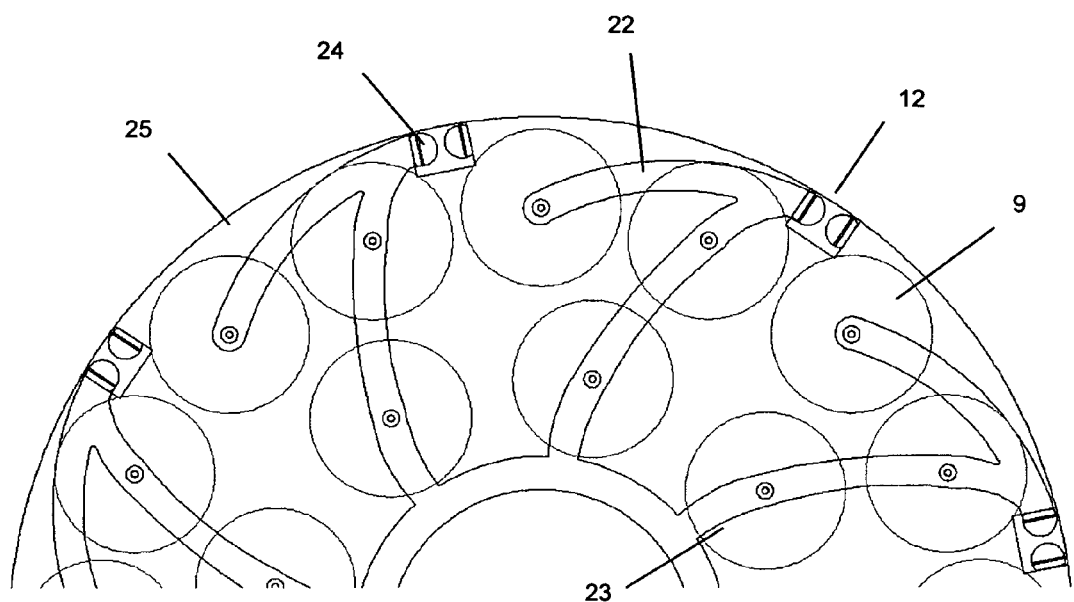

The Marx stages are implemented in a modular configuration. As illustrated in FIG. 7, a single stage is comprised of the parallel stage capacitors 9, the parallel stage spark gaps 12, two interconnecting brass tabs 22, charging inductors 23, and a circular stage insulator plate 25.

The parallel stage capacitors 9 are specifically designed to be distributed around and near the insulated circumference, maintaining a minimal inductance loop with the ground plane, and are mounted to the interconnecting tabs 22 with screws. The interconnection tabs are fixed to the stage insulator by way of the spark gap electrodes 24 that mount transversely to the stage insulator with mounting screws. The spark gap electrodes are located with minimal spacing between the insulating liner and the electrodes, so as to minimize inductance. Locating the capacitors and the spark gap switches in close proximity to the ground plane, and evenly distributing them around the circular cross section simulates a coaxial conduction path that results in the desired minimized source impedance.

The circular stage insulator plate 25 of FIGS. 8a and 8b provides three primary functions: (1) to insulate the voltage potential between neighboring stage capacitors 9, (2) to provide the mechanical structure for mounting the spark gap switches 12, and (3) to provide the mechanism for flowing the insulating gas medium through each of the spark gap switches 12.

The circular stage insulator 25 features a large diameter hole 26 that functions as the main gas conduit and provides enough volume to maintain high flow rates of gas through each of the parallel spark gaps. As illustrated in FIGS. 9a and 9b, small diameter passageways 27 communicate between openings 28 in the inner wall of main gas conduit 26 and the stage spark gaps 12. Passageways 27 carry the gas that purges the spark gaps between firings.

Parallel switching requires the following conditions: (1) preionization of the spark gaps with ultra-violet illumination, and (2) adequate time for each parallel switch to close before the voltage collapses due to one switch closing before the others.

Preionization of a spark gap is critical to fast switching behavior. As illustrated in FIG. 8, the present invention stages are stacked in a manner that aligns the spark gaps in a vertical orientation that permits each gap to "see" the preceding gap. As a result, closure of the first gap emits a burst of ultra-violet light that ionizes the next stage gap, which in turn ionizes subsequent switches.

Close proximity of the spark gap switches to the ground plane is also important to the parallel switching process. As discussed in the Background section, wave erection relies on the tailored design of the stray capacitance, or more specifically, the stray-to-ground capacitance at each stage. This capacitance provides each spark gap switch with a strong reference to ground, and collapsed switch voltages to appear across the next stage switch instead of the voltage being equally divided among all subsequent switches. The parallel switching design relies on the strong ground reference so that extreme overvoltage conditions exist on each switch, as defined by the wave erection principle.

The design of the interconnection tab is of paramount importance to the parallel switching scheme. In general, parallel switching is difficult, since all of the parallel switches share a common voltage potential. If the switches do not close simultaneously, as in the case of spark gaps that are inherently statistical in their breakdown behavior, the voltage collapse across the first switch closure results in the voltage collapse across the remaining open switches, and the electrical current simply propagates through the single closed switch.

The general approach to achieving parallel switching is to design an electrical propagation delay between neighboring switches. This may be achieved either by geometrical means or via isolation inductors that are designed to momentarily appear as high impedance elements for a time that will facilitate neighboring switch closure.

The preferred embodiment of the present invention illustrates the above mentioned geometrical means. As illustrated in FIG. 7, the interconnection tab 22 efficiently connects the stage capacitors 9 that are in the immediate vicinity of the switch 12. However, the path to neighboring spark gap switches is relatively long, with a path length designed to result in a propagation time greater than the time required for the spark gap switch to close.

It will be apparent to those with ordinary skill in the relevant art having the benefit of this disclosure that the present invention provides a Marx-type pulse generator capable of high voltage output pulsed at a high repetition rate. It is understood that the form of the invention shown and described in the detailed description and the drawings is to be taken merely as the currently preferred embodiment, and that the invention is limited only by the language of the claims. The drawings and detailed description presented herein are not intended to limit the invention to the particular embodiment disclosed. While the present invention has been described in terms of one preferred embodiment, it will be apparent to those skilled in the art that form and detail modifications can be made to the described embodiment without departing from the spirit or scope of the invention.

I claim:

1. A low impedance pulse generator comprising:
a high voltage power supply;
a high-voltage trigger source;
a Marx-type circuit having multiple stages, said stages each having a stage voltage distributed over multiple stage capacitors;
multiple parallel switches in each said stage electrically connected to said stage capacitors with at least one interconnection tab;
an electrically conductive external housing, said housing providing ground reference for said Marx-type circuit;
an electrically insulating housing between said external housing and said Marx-type circuit; and
an output connection that gangs the output potentials erected across said multiple parallel switches.

2. A pulse generator as in claim 1 wherein resistive charging elements of the Marx-type circuit are replaced with inductive charging elements.

3. A pulse generator as in claim 1 wherein said stages are insulated from each other with insulating plates.

4. A pulse generator as in claim 3 wherein said stage capacitors are in close proximity to at least one said insulating plate.

5. A pulse generator as in claim 1 wherein said stage capacitors are proximate to said ground reference.

6. A pulse generator as in claim 1 wherein said switches in a said stage are proximate to said stage capacitors in that said stage.

7. A pulse generator as in claim 1 wherein said switches are proximate to said ground reference.

8. A pulse generator as in claim 1 wherein each said switch has a dedicated trigger circuit.

9. A pulse generator as in claim 1 wherein said switches are triggered by a common main trigger switch.

10. A pulse generator as in claim 1 wherein said interconnection tab provides a current propagation time between consecutive said switches greater than the time required to close said switches.

11. A pulse generator as in claim 1 wherein isolation conductors provide a current propagation time between consecutive switches greater than the time required to close said switches.

12. A pulse generator as in claim 1 wherein said switches are alignable in a manner assuring that some light waves emanating from one said switch will irradiate at least one other said switch.

13. A pulse generator as in claim 1 wherein a charging inductor connects each said stage to an adjacent said stage.

14. A pulse generator as in claim 1 wherein each said switch of each said stage communicates with a common conduit through which a fluid may flow.

15. A pulse generator as in claim 14 wherein said fluid is a gas.

16. A pulse generator as in claim 14 wherein said fluid is air.

17. A pulse generator as in claim 14 wherein said fluid is filtered air.

18. A pulse generator as in claim 14 wherein said fluid is a liquid.

19. A low impedance pulse generator comprising:
a high voltage power supply;
a high-voltage trigger source;
a Marx-type circuit having multiple stages, said stages each having a stage voltage distributed over multiple stage capacitors, with resistive charging elements of the Marx-type circuit being replaced with inductive charging elements, with said stages being insulated from each other with insulating plates, with said stage capacitors being in close proximity to at least one said insulating plate and said ground reference, and with a charging inductor connecting each said stage to an adjacent said stage;
multiple parallel switches in each said stage electrically connected to said stage capacitors with at least one interconnection tab, with said switches in a said stage being proximate to said stage capacitors in that said stage and proximate to said ground reference, with each said switch having a dedicated trigger circuit, with said switches being triggered by a common main trigger switch, with said interconnection tab providing a current propagation time between consecutive switches greater than the time required to close said switches, with said switches being alignable in a manner assuring that some light waves emanating from one said switch will irradiate at least one other said switch, and with each said switch of each said stage communicating with a common conduit through which a fluid may flow;
an electrically conductive external housing, said housing providing ground reference for said Marx-type circuit;
an electrically insulating housing between said external housing and said Marx-type circuit; and
an output connection that gangs the output potentials erected across said multiple parallel switches.

20. A low impedance pulse generator comprising:
a high voltage power supply;
a high-voltage trigger source;
a Marx-type circuit having multiple stages, said stages each having a stage voltage distributed over multiple stage capacitors, with resistive charging elements of the Marx-type circuit being replaced with inductive charging elements, with said stages being insulated from each other with insulating plates, with said stage capacitors being in close proximity to at least one said insulating plate and said ground reference, and with a charging inductor connecting each said stage to an adjacent said stage;

multiple parallel switches in each said stage electrically connected to said stage capacitors with an interconnection tab, with said switches in a said stage being proximate to said stage capacitors in that said stage and proximate to said ground reference, with each said switch having a dedicated trigger circuit, with said switches being triggered by a common main trigger switch, with said switches being alignable in a manner assuring that some light waves emanating from one said switch will irradiate at least one other said switch, and with each said switch of each said stage communicating with a common conduit through which a fluid may flow;

isolation conductors providing a current propagation time between consecutive said switches greater than the time required to close said switches;

an electrically conductive external housing, said housing providing ground reference for said Marx-type circuit;

an electrically insulating housing between said external housing and said Marx-type circuit; and an output connection that gangs the output potentials erected across said multiple parallel switches.

* * * * *